(12) United States Patent
Lischeck et al.

(10) Patent No.: US 8,575,498 B2
(45) Date of Patent: Nov. 5, 2013

(54) ELECTRICAL CIRCUITRY

(75) Inventors: Andre Lischeck, Vaihingen/Enz (DE); Juergen Stein, Illingen (DE)

(73) Assignee: Robert Bosch GmbH, Stuttgart (DE)

( * ) Notice: Subject to any disclaimer, the term of this patent is extended or adjusted under 35 U.S.C. 154(b) by 272 days.

(21) Appl. No.: 12/737,446

(22) PCT Filed: Jun. 15, 2009

(86) PCT No.: PCT/EP2009/057357
§ 371 (c)(1),
(2), (4) Date: Mar. 31, 2011

(87) PCT Pub. No.: WO2010/006862
PCT Pub. Date: Jan. 21, 2010

(65) Prior Publication Data
US 2011/0168441 A1    Jul. 14, 2011

(30) Foreign Application Priority Data
Jul. 17, 2008 (DE) .......................... 10 2008 040 504

(51) Int. Cl.
*H05K 5/00* (2006.01)
*H05K 1/00* (2006.01)

(52) U.S. Cl.
USPC .......................................... 174/520; 174/254

(58) Field of Classification Search
CPC ....................................................... H05K 5/00
USPC ............................................... 174/254, 520
See application file for complete search history.

(56) References Cited

U.S. PATENT DOCUMENTS

| | | | |
|---|---|---|---|
| 4,969,827 A * | 11/1990 | Hahs, Jr. | 439/68 |
| 5,156,552 A | 10/1992 | Zaderej et al. | |
| 7,686,620 B2 * | 3/2010 | Liao et al. | 439/71 |
| 7,916,491 B2 * | 3/2011 | Fino et al. | 174/520 |
| 8,194,400 B2 * | 6/2012 | Horii | 361/679.08 |
| 2004/0217768 A1* | 11/2004 | Kister et al. | 324/754 |
| 2010/0284143 A1* | 11/2010 | Lev et al. | 361/679.55 |
| 2012/0155054 A1* | 6/2012 | McColloch | 361/818 |

FOREIGN PATENT DOCUMENTS

| | | |
|---|---|---|
| CN | 1308387 | 8/2001 |
| EP | 1 901 397 | 3/2008 |
| KR | 10-2004-0042300 | 5/2004 |
| TW | 249269 | 2/2006 |

* cited by examiner

*Primary Examiner* — Timothy Thompson
*Assistant Examiner* — Charles Pizzuto
(74) *Attorney, Agent, or Firm* — Kenyon & Kenyon LLP

(57) ABSTRACT

An electrical circuitry has a base element, a printed circuit board and a fastening apparatus for fastening the printed circuit board to the base element. The fastening apparatus retains the printed circuit board by virtue of the base element being present on a top side and underside of the printed circuit board. In this case, the base element acts upon the top side and underside of the printed circuit board at application points which are opposite one another at an offset with respect to one another while elastically deforming the printed circuit board.

18 Claims, 2 Drawing Sheets

ELECTRICAL CIRCUITRY

BACKGROUND OF THE INVENTION

1. Field of the Invention

The present invention relates to an electrical circuitry having a base element, a printed circuit board and a fastening apparatus for fastening the printed circuit board to the base element, the fastening apparatus retaining the printed circuit board by virtue of the base element being present on a top side and underside of the printed circuit board.

2. Description of the Related Art

Electrical circuitries of the type stated above are known. For example, published Korean patent application KR-2004042300-A describes a fastening apparatus that may be used to fasten a printed circuit board to a base element. To that end, a screw applies a force to the printed circuit board in the direction of the base element from one side, while counter-elements of the printed circuit board provide a counteracting force from the other side. In this manner, the printed circuit board is held at a distance from the base element without the force applied by the screw to the printed circuit board bending the printed circuit board. However, if a thermal load is applied to the electrical circuitry, varying coefficients of expansion of the base element and printed circuit board may result in thermal-related material stresses. Since the printed circuit board is firmly fastened to the base element, it is able to produce a deformation of the printed circuit board. If the electrical circuitry is exposed to continuously changing environmental conditions, i.e., in particular a constantly changing temperature, the printed circuit board and the soldering joints located on the printed circuit board may be irreparably damaged by the continuously changing material stresses and the resulting deformations. In this case, a complex fault analysis must be performed and frequently the entire electrical circuitry must be replaced.

BRIEF SUMMARY OF THE INVENTION

In contrast, the electrical circuitry of the present invention has the advantage that the printed circuit board is fastened to the base element in such a way that no or only slight material stresses are able to occur in the printed circuit board. This is achieved in that the base element acts upon the top side and underside of the printed circuit board at application points which are opposite one another at an offset with respect to one another while elastically deforming the printed circuit board. This means that the application points are not directly opposite one another on the top side and underside of the printed circuit board. In this case, the printed circuit board is only able to be held by pressure contact. In this connection, it must be designed in such a way that the printed circuit board is firmly retained, so that it is not possible to compensate for material stresses, for example thermal-related material stresses, of the printed circuit board. Therefore, it is provided according to the present invention that the application points are offset with respect to one another, i.e., they are not directly opposite one another. It is possible in this manner to ensure that the printed circuit board is retained on the base element by the elastic deformation of the printed circuit board. The application points which are opposite one another at an offset with respect to one another thus come into contact with the base element in such a way that the application points are deflected with respect to one another in one application direction. Due to the elastic deformation of the printed circuit board, a retaining force directed opposite to the base element is present at each application point. This floating attachment of the printed circuit board to the base element makes it possible to compensate for deformations of the printed circuit board due to material stresses. The application points are able to move in relation to the base element and in so doing counteract the development of material stresses.

According to one further refinement of the present invention, at least one retaining tongue on which the at least one application point is provided is formed on the printed circuit board. As a result, the elastic deformation of the printed circuit board occurs only in the area of the retaining tongue, while the remaining printed circuit board surface, which does not have the retaining tongue, may not be subject to deformation.

In this manner, the point at which an elastic deformation of the printed circuit board occurs may be situated in a targeted manner. Alternatively, a plurality of application points may also be provided on one retaining tongue. It is also possible to form additional retaining tongues on one retaining tongue. It is possible to control the retaining force, i.e., the force the retaining tongue applies to the base element, via the cross-section and/or the length of the retaining tongue. This means that the seat of the printed circuit board, i.e., a resistance against a displacement of the printed circuit board, is defined via the design of the retaining tongue geometry. The retaining tongue may, for example, be a tongue made from an elastic material which is fastened to the printed circuit board. Alternatively, it may also be provided that the retaining tongue is formed from the printed circuit board.

According to one further refinement of the present invention, the retaining tongue is formed by at least one clearance cut penetrating the printed circuit board. The retaining tongue is thus formed by the printed circuit board. The retaining tongue is separated from adjacent areas of the printed circuit board by the clearance cut and is thus able to move freely in relation to it in the area of the clearance cut. Preferably the clearance cut is provided in such a way that only one edge of the retaining tongue is connected to the rest of the printed circuit board. This edge forms an approximation of an axis of rotation, in relation to which the elastic deformation of the printed circuit board or the retaining tongue is provided. The clearance cut may be used to design the retaining tongue to be of any shape. For example, the retaining tongue may be rectangular. However, it may also be provided that in the area of the application point, the retaining tongue has a larger or a smaller cross section than on the edge on which the retaining tongue is connected to the rest of the printed circuit board. Since a milling step is performed in the production of the printed circuit board, no additional work step is necessary for applying the clearance cut.

According to one further refinement of the present invention, at least two retaining tongues have an identical cross section and/or an identical length. The retaining tongues are in particular designed in such a way that a deflection of the retaining tongues, i.e., the elastic deformation, is essentially equal when acted upon by the base element. It is particularly advantageous if the at least two retaining tongues are adjacent to one another and are acted upon on the top side and the underside of the printed circuit board. This results in an opposite deflection of the retaining tongues by an essentially equal distance.

According to one further refinement of the present invention, the printed circuit board is made of an elastic material. Manufacturing the printed circuit board from an elastic material makes it possible to provide a particularly good spring action of the printed circuit board. The elasticity of the material of the printed circuit board and one position of the application points or of the retaining tongues may be matched to one another in order to achieve optimal fastening of the printed circuit board to the base element.

According to one further refinement of the present invention, the base element is a housing in which the printed circuit board is at least partially situated. The printed circuit board is thus at least partially situated in the housing and retained there using the fastening apparatus while elastically deforming the printed circuit board. The printed circuit board may also be completely enclosed by the housing. The housing may have a multi-part design and in particular have a housing cover and a housing bottom. The housing cover and the housing bottom form the base element. The electrical circuitry is assembled by inserting the printed circuit board into the housing cover or the housing bottom. The housing cover and housing bottom are subsequently joined to one another. The joining of the housing cover and housing bottom presses them onto the application points of the printed circuit board. This causes the printed circuit board to be elastically deformed, via which the printed circuit board is retained in the center of the housing.

According to one further refinement of the present invention, the printed circuit board is situated at a distance from a housing wall of the housing. A lateral distance is provided in particular. Due to the distance between the housing wall and the printed circuit board and the floating attachment of the printed circuit board in the housing, the printed circuit board is able to expand, in particular if material stresses occur, without coming into contact with the housing wall of the housing. This avoids the occurrence of material stresses in the printed circuit board and damage to it resulting from the printed circuit board being in contact with the housing wall despite the floating position of the printed circuit board in the housing.

According to one further refinement of the present invention, an electrical connection between at least one contact situated on the application point and at least one contacting means provided on the base element is produced via the fastening apparatus. Thus electrical terminals of the printed circuit board are led out via the fastening apparatus or are picked off by the fastening apparatus. The contact which produces a connection with the contacting means of the base element is provided on the application point. In this manner, any number of connections may be routed from the printed circuit board to the base element. The reliable electrical connection is ensured by the retaining force applied by contact of the base element with the printed circuit board. This retaining force presses the contact onto the contacting means, producing the electrical connection.

According to one further refinement of the present invention, material stresses occurring in the printed circuit board, in particular thermal material stresses, may be compensated by the fastening apparatus. The fastening apparatus thus retains the printed circuit board in such a way that it is able to expand and contract, in particular in a lateral direction. The material stresses present in the printed circuit board may be compensated in this way. If an electrical connection is produced between the contact and the contacting means via the fastening apparatus, this electrical connection advantageously continues to exist even if the printed circuit board moves in relation to the base element due to the material stresses.

According to one further refinement of the present invention, the contact is provided as a contact point and/or contact surface on one surface of the printed circuit board. For example, the contact may be designed as part of a printed conductor track of the printed circuit board which forms a contact point on the surface of the printed circuit board. Advantageously, the contact may be designed as a contact surface. Compared to the contact point, it has a larger surface and therefore makes it possible to ensure that an electrical connection is present between the contact and contacting means if the printed circuit board is displaced in relation to the base element. Like the contact point, the contact surface may also be designed as part of a printed conductor track, i.e., for example, as an exposed copper surface on the surface of the printed circuit board. It is also possible for the contact point and/or the contact surface to have an extension in the vertical direction. For example, the contact point may be provided as a soldering joint having soldering agent applied to it. The contact surface may be designed, for example, as a plate, in particular as a metal plate, and thus have an extension in the vertical direction.

According to one further refinement of the present invention, the contacting means are provided by the base element and/or are an electrical ground. It may be provided that the contact of the printed circuit board produces an electrical connection with the base element directly. In this case, the contacting means may be formed by the base element and the base element is made from a conductive material, in particular metal. The contacting means may also represent an electrical ground to which the printed circuit board is connected. Advantageously, the base element represents the electrical ground and simultaneously forms the contacting means. In this case, the printed circuit board produces a connection to the base element, and accordingly to the electrical ground via the contact, as soon as the printed circuit board is retained by the base element.

One further refinement of the present invention is characterized by a terminal strip assigned to the printed circuit board via which the at least one electrical connection to a contact strip situated on the base element may be produced. The electrical connection may thus be produced via the terminal strip which produces a connection with the contact strip of the base element, for example by plugging in or plugging on. The contact strip and the terminal strip may have any number of terminals, so that at least one electrical connection may be produced. The terminal strip and/or contact strip may have spring terminals, so that the terminal strip and contact strip may be displaced relative to one another, for example for compensating material stresses, while the electrical connection is preserved. However, it may also be provided that the terminal strip and contact strip are connected rigidly to one another. In this case, a terminal strip must only be provided on one side of the printed circuit board in order to make it possible to compensate for material stresses caused by a movement of the printed circuit board.

DETAILED DESCRIPTION OF THE INVENTION

Figure 1:
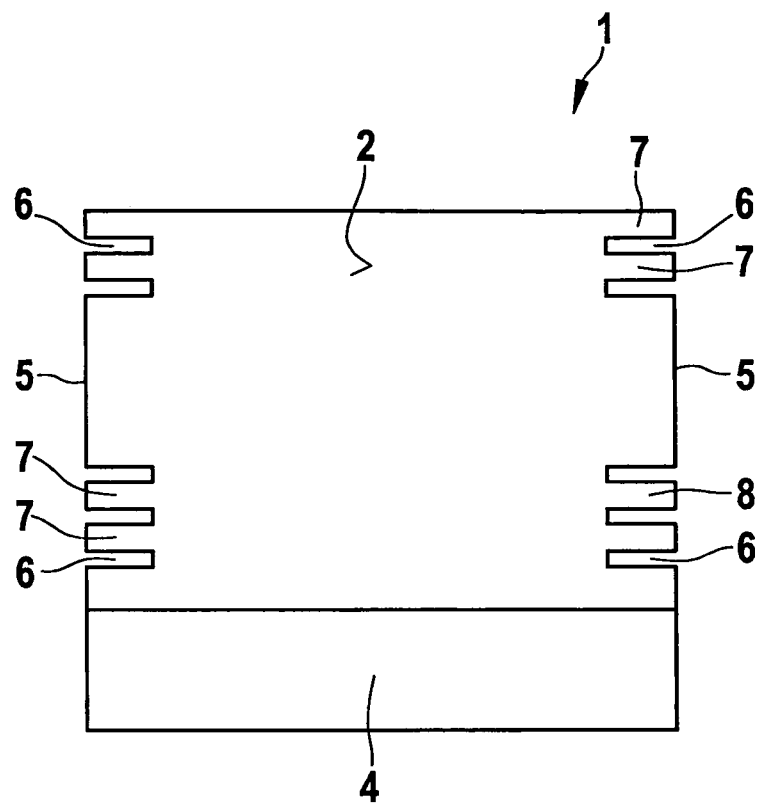
FIG. 1 shows a printed circuit board having a terminal strip and application points.

FIG. 1 shows a printed circuit board 1 having a top side 2 and an underside 3 (not visible in FIG. 1). Printed circuit board 1 is essentially designed in the form of a rectangle. On one side, it has a terminal strip 4 for producing an electrical connection. Starting from lateral edges 5 of printed circuit board 1, printed circuit board 1 is penetrated by clearance cuts 6, resulting in the formation of retaining tongues 7. Compared to the plane formed by printed circuit board 1, retaining tongues 7 may be deflected elastically in a perpendicular direction. In the example shown in FIG. 1, two retaining tongues 7 are situated next to one another. These retaining tongues are designed in such a way that they have both the same length and the same cross section. Application points 8 are situated on retaining tongues 7 and are used to attach printed circuit board 1. On adjacent retaining tongues 7, one application point 8 is assigned to top side 2 and one additional application point 8 is assigned to underside 3 of printed circuit board 1.

Figure 2:
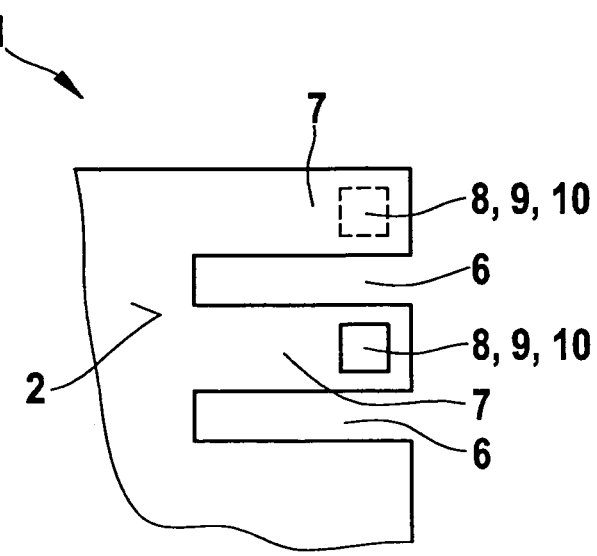
FIG. 2 shows a detail of the printed circuit board having application points situated on retaining tongues.

FIG. 2 shows a detail of printed circuit board 1 having two retaining tongues 7. Retaining tongues 7 are formed in printed circuit board 1 by clearance cuts 6 in the manner described. One retaining tongue 7 has an application point 8 on top side 2 of printed circuit board 1 and other retaining tongue 7 has an application point on bottom side 3. One contact 9 is provided on each application point 8, contact 9 being designed as contact surface 10.

Figure 3:
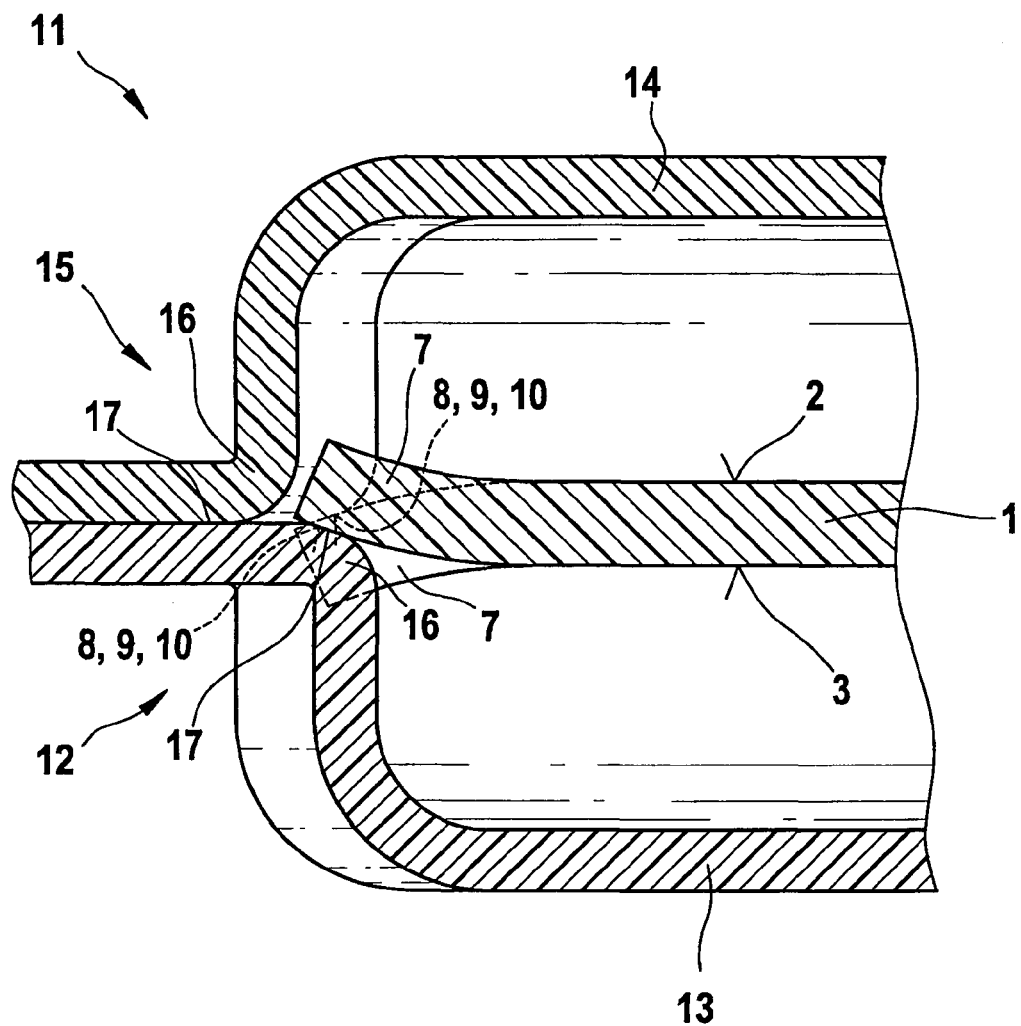
FIG. 3 shows a housing having a printed circuit board situated within it.

FIG. 3 shows an electrical circuitry 11 having a printed circuit board 1 and a housing 12 which is made up of housing bottom 13 and housing cover 14. Printed circuit board 1 is fastened by fastening apparatus 15 to a base element 16, which, in the example shown, is housing 12. The fastening is done in such a way that base element 16 comes into contact with one application point 8 on a retaining tongue 7 of printed circuit board 1 on bottom side 3 of printed circuit board 1 and retaining tongue 7 is deflected upward. At the same time, base element 16 comes into contact with adjacent retaining tongue 7 or its application point 8 and deflects retaining tongue 7 downward. In doing so, contact surfaces 10 of application points 8 and therefore the contacts 9, come into contact with contacting means 17 of base element 16. Via this connection, printed circuit board 1 is in electrical contact with housing 12 which represents an electrical ground. Furthermore, printed circuit board 1 may be in contact with a contact strip (not shown) via terminal strip 4, the contact strip being assigned to base element 16 or housing 12. Printed circuit board 1 is manufactured from an elastic material. This makes it possible to deflect retaining tongues 7 in a simple manner and thus fasten printed circuit board 1 in housing 12 using fastening apparatus 15. This fastening retains printed circuit board 1 in housing 12 in such a way that printed circuit board 1 is readily able to compensate material stresses, in particular temperature-related material stresses, in that at least one of application points 8 is displaced in relation to base element 16 or housing 12.

What is claimed is:

1. An electrical circuitry, comprising:
   a base element having a fastening portion; and
   a printed circuit board;
   wherein the fastening portion is configured to fasten the printed circuit board to the base element by retaining the printed circuit board, the retaining being achieved by virtue of the fastening portion of the base element being present both on a top side and underside of the printed circuit board, and wherein the fastening portion of the base element acts upon the top side and underside of the printed circuit board at application points which are opposite one another at an offset with respect to one another while elastically deforming the printed circuit board.

2. The electrical circuitry as recited in claim 1, wherein at least one retaining tongue is formed on the printed circuit board, and wherein at least one application point is provided on the retaining tongue.

3. The electrical circuitry as recited in claim 2, wherein the retaining tongue is formed by at least one clearance cut penetrating the printed circuit board.

4. The electrical circuitry as recited in claim 3, wherein at least two retaining tongues are provided, the two retaining tongues having at least one of an identical cross section and an identical length.

5. The electrical circuitry as recited in claim 3, wherein the printed circuit board is made from an elastic material.

6. The electrical circuitry as recited in claim 3, wherein the base element is a housing in which the printed circuit board is at least partially situated.

7. The electrical circuitry as recited in claim 6, wherein the printed circuit board is situated at a distance from a housing wall of the housing.

8. The electrical circuitry as recited in claim 3, wherein an electrical connection between at least one contact situated on the application point and at least one contacting arrangement provided on the base element is produced via the fastening portion.

9. The electrical circuitry as recited in claim 8, wherein the fastening portion is configured to compensate for thermal material stresses occurring in the printed circuit board.

10. The electrical circuitry as recited in claim 8, wherein the at least one contact is configured as at least one of a contact point and a contact surface on one surface of the printed circuit board.

11. The electrical circuitry as recited in claim 8, wherein the contacting arrangement is formed by at least one of the base element and an electrical ground.

12. The electrical circuitry as recited in claim 3, further comprising:
   a terminal strip assigned to the printed circuit board, wherein at least one electrical connection is made to a contact strip situated on the base element via the terminal strip.

13. The electrical circuitry as recited in claim 1, wherein thermal expansion coefficients of the base element and the printed circuit board are different.

14. The electrical circuitry as recited in claim 1, wherein:
   each of the application points is located on a respective retaining tongue formed on the printed circuit board; and
   the fastening portion acts upon the top side and underside of the printed circuit board by pressing against the application points such that a retaining tongue with an application point on the underside is deflected upward, while a retaining tongue with an application point on the top side is deflected downward.

15. The electrical circuitry as recited in claim 1, wherein the fastening portion acts on application points located on opposite edges of the printed circuit board.

16. The electrical circuitry as recited in claim 1, wherein:
   at least one retaining tongue is formed on the printed circuit board;
   at least one application point is provided on the at least one retaining tongue; and
   the fastening portion is configured to compensate for thermal material stresses occurring in the printed circuit board by acting on the at least one application point as the at least one application point moves relative to the base element in response to temperature induced deformation of the printed circuit board.

17. The electrical circuitry as recited in claim 16, wherein the at least one retaining tongue is formed by at least one clearance cut penetrating the printed circuit board.

18. The electrical circuitry as recited in claim 16, wherein an electrical connection between at least one contact situated on the at least one application point and at least one contacting arrangement provided on the base element is produced via the fastening portion.

* * * * *

UNITED STATES PATENT AND TRADEMARK OFFICE
CERTIFICATE OF CORRECTION

PATENT NO.         : 8,575,498 B2                                              Page 1 of 1
APPLICATION NO.    : 12/737446
DATED              : November 5, 2013
INVENTOR(S)        : Lischeck et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 346 days.

Signed and Sealed this
Twenty-second Day of September, 2015

Michelle K. Lee
*Director of the United States Patent and Trademark Office*